(12) United States Patent
Garioni

(10) Patent No.: US 6,491,155 B2
(45) Date of Patent: Dec. 10, 2002

(54) DEVICE FOR HOOKING PIECES, IN PARTICULAR PRINTED CIRCUITS, ON TRANSPORT LINES PRESENT IN TUNNEL TYPE KILNS AND THE LIKE

(76) Inventor: Alessandro Garioni, Via Don Sturzo, 31, I-20078 San Colombano al Lambro (MI) (IT)

( * ) Notice: Subject to any disclaimer, the term of this patent is extended or adjusted under 35 U.S.C. 154(b) by 0 days.

(21) Appl. No.: 09/955,060

(22) Filed: Sep. 19, 2001

(65) Prior Publication Data

US 2002/0011736 A1 Jan. 31, 2002

Related U.S. Application Data

(62) Division of application No. 09/140,687, filed on Aug. 26, 1998, now Pat. No. 6,315,345.

(30) Foreign Application Priority Data

Aug. 26, 1997 (IT) .......................................... PC970019 U

(51) Int. Cl.⁷ ............................................... B65G 47/86
(52) U.S. Cl. .................................. 198/803.7; 198/470.1
(58) Field of Search ........................... 198/803.7, 470.1

(56) References Cited

U.S. PATENT DOCUMENTS

| | | |
|---|---|---|
| 1,217,030 A | 2/1917 | Long |
| 1,976,848 A | 10/1934 | Ham |
| 2,776,856 A | 1/1957 | Ingram |
| 2,782,067 A | 2/1957 | Bonte et al. |
| 3,264,030 A | 8/1966 | Albert |
| 3,904,027 A | 9/1975 | Gilles et al. |
| 4,149,623 A * | 4/1979 | Nelson ......................... 198/477 |
| 4,172,514 A * | 10/1979 | Shantz et al. ................ 198/479 |
| 4,174,060 A | 11/1979 | Porat |
| 4,183,428 A * | 1/1980 | McGill et al. ............... 198/479 |
| 4,183,571 A | 1/1980 | Renfroe |
| 4,201,286 A * | 5/1980 | Meier ........................... 198/461 |
| 4,288,313 A | 9/1981 | Bormke et al. |
| 4,320,894 A * | 3/1982 | Reist et al. ................... 271/277 |
| 4,369,587 A * | 1/1983 | David ........................... 34/150 |
| 4,408,560 A | 10/1983 | Caratsch |
| 4,425,996 A * | 1/1984 | Hoffmann .................... 198/653 |
| 4,709,910 A * | 12/1987 | Honegger ..................... 270/55 |
| 4,727,979 A * | 3/1988 | Wolfson et al. ........... 198/803.3 |
| 4,834,232 A * | 5/1989 | Freermann ................ 198/468.2 |
| 4,903,818 A | 2/1990 | Loehr et al. |
| 4,915,283 A * | 4/1990 | Buchko et al. ............. 226/173 |
| 4,921,294 A * | 5/1990 | Klopfenstein ............... 294/99.1 |
| 5,071,305 A | 12/1991 | Curti |
| 5,244,078 A * | 9/1993 | Silva et al. ............... 198/464.3 |
| 5,360,101 A * | 11/1994 | Carlen ...................... 198/803.7 |
| 5,419,427 A * | 5/1995 | Wurgler .................... 198/803.7 |
| 5,542,526 A * | 8/1996 | Wurgler .................... 198/803.7 |
| 5,575,379 A * | 11/1996 | Schmetzer ................ 198/803.7 |
| 5,722,530 A * | 3/1998 | Gunschera ................ 198/803.7 |
| 5,893,595 A | 4/1999 | Corbett |
| 6,116,592 A * | 9/2000 | Gunschera ................... 271/204 |
| 6,193,046 B1 * | 2/2001 | Segawa et al. ............ 198/339.1 |
| 6,213,280 B1 * | 4/2001 | Abbadessa et al. ..... 198/377.02 |
| 6,213,461 B1 * | 4/2001 | Ratz et al. .................... 271/187 |
| 6,227,589 B1 * | 5/2001 | Brown et al. ................ 294/104 |
| 6,302,172 B1 * | 10/2001 | De Villele .................... 141/372 |
| 6,315,345 B1 * | 11/2001 | Garioni ...................... 294/103.1 |
| 6,325,592 B1 * | 12/2001 | Maier ......................... 414/790.5 |

* cited by examiner

Primary Examiner—Christopher P. Ellis
Assistant Examiner—Rashmi Sharma
(74) Attorney, Agent, or Firm—Young & Thompson

(57) ABSTRACT

A device for the hooking of printed circuits includes a support constituted by a roughly U-shaped structural shape with a seating designed to allow the insertion of the printed circuit, one or more pins inserted into holes in one wall of the structural shape, and thrust systems designed to push the pins against the opposite wall of the structural shape, and devices designed to engage the thrust systems in order to retract the pins and allow the insertion of a printed circuit.

6 Claims, 2 Drawing Sheets

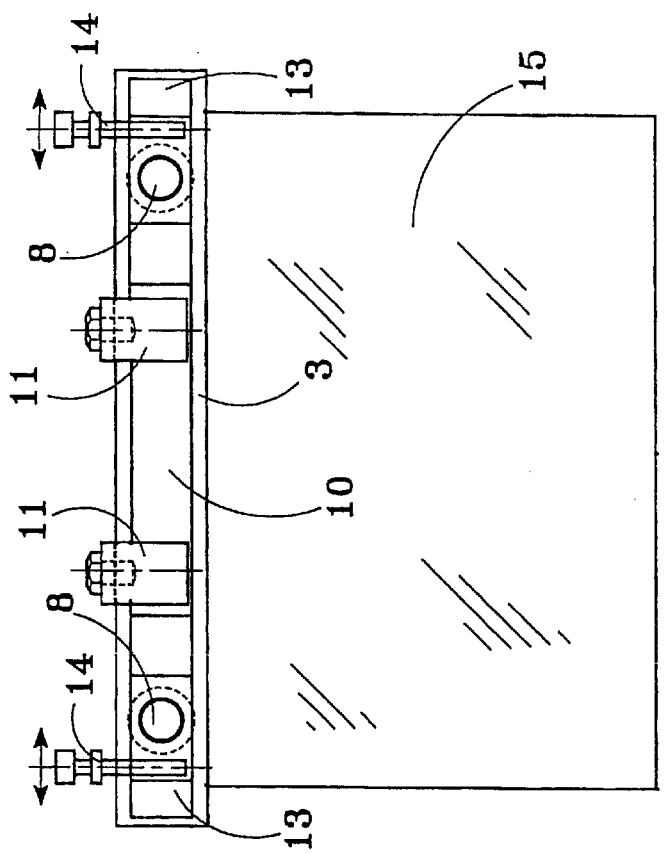
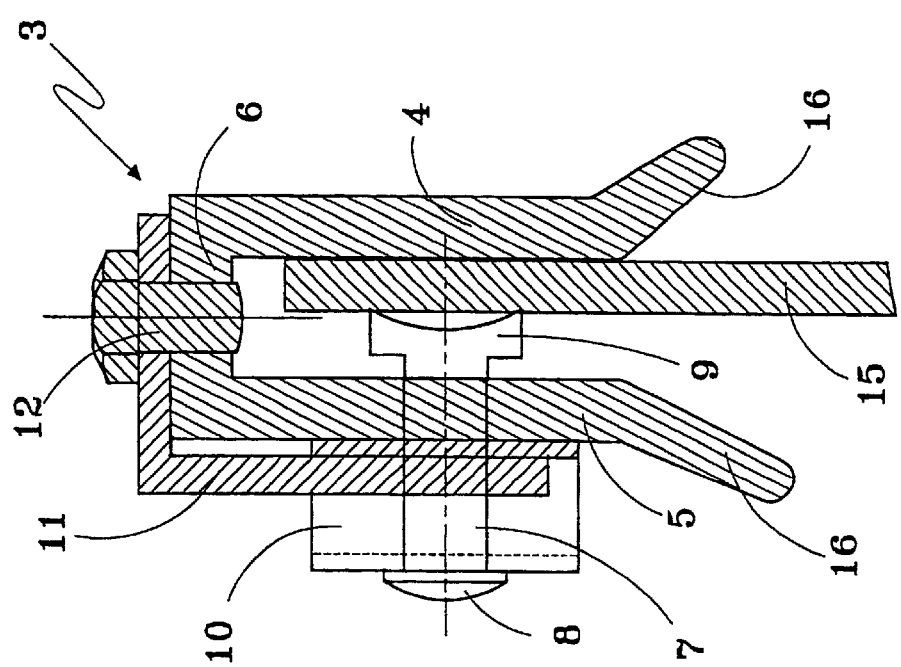
Fig. 4
Fig. 3

DEVICE FOR HOOKING PIECES, IN PARTICULAR PRINTED CIRCUITS, ON TRANSPORT LINES PRESENT IN TUNNEL TYPE KILNS AND THE LIKE

This application is a continuation division of application Ser. No. 09/140,687, filed on Aug. 26, 1998, now U.S. Pat. No. 6,315,345 the entire contents of which are hereby incorporated by reference.

BACKGROUND OF THE INVENTION

This invention relates to a device designed to hook pieces, in particular printed circuit boards, onto transport lines present in tunnel kilns or similar kilns.

The device in accordance with the invention can be classified among the equipment used to manufacture electronic cards or printed circuits, and in particular among the equipment used during the circuit firing stage in a kiln.

DESCRIPTION OF THE RELATED ART

The manufacture of printed circuits such as those of computer boards uses photographic processes to make the tracks or pattern of the circuit on a base plate, which consists of one or more layers of copper or other conductive material.

For this purpose a layer of material sensitive to ultraviolet light, for example, is spread on the plate; that layer is photographically exposed, and the plate is then introduced into baths that dissolve the unexposed layer and the underlying layer made of conductive material to produce the circuit tracks.

These known procedures comprise various stages; including the stage when the said sensitive layer is fired, during which the plates that constitute the circuit base are introduced into a kiln, usually the tunnel type, in which the coating layer is "fired".

For the purpose of firing, each card is passed one or more times through a tunnel kiln together with other similar cards.

The existing conveyor equipment for the firing of rigid printed circuits allows the circuit boards to be introduced in succession into supports constituted by structural shapes arranged transversely on a conveyor belt situated in the lower part of the route, so that the boards maintain a vertical position as they advance through the kiln.

This type of equipment, which is used to handle basically rigid printed circuits, does not need to be fitted with restraint and gripping mechanisms, and is consequently unsuitable to support or move the more recent flexible circuits, as in this case the boards cannot maintain a vertically leaning position, and must therefore be hung from a transport line installed in the upper part of the tunnel and fitted with gripping jaws.

The main drawback encountered with the use of known systems for the transport of flexible printed circuits is that they use complex, bulky jaw assemblies, each of which is associated with pneumatic drive devices; this increases the cost of manufacture and also restricts the number of printed circuits that can be hung from the conveyor, due to the excessive bulk of these gripper activation devices.

SUMMARY OF THE INVENTION

The invention provides a new gripping system for the advance of flexible printed circuits through a tunnel kiln or the like, the main objective of which is to reduce the complexity of manufacture, thus limiting both production costs and overall dimensions, as the components of the hooking parts are simplified.

The immediate advantage of the proposed system is that the reduction in overall dimensions leads to a considerable increase in the carrying capacity of the conveyor line and in the number of circuits that can be treated simultaneously on the same line.

A further advantage of the innovation in question is that it features a new gripping system which eliminates components secured by screws or other screwing systems; such components, which are present in known hooking devices, can generate critical situations such as breakage or jamming of the gripping parts when they pass through the kiln at high temperature. These particular purposes, advantages and functions are all achieved, in accordance with this invention, by a device for hooking pieces, in particular printed circuits, to transport lines present in tunnel kilns and the like, in accordance with which shaped supports are fitted transversely to a conveyor belt, slat conveyor or the like, the said supports being constituted by roughly U-shaped guides fitted with elastic systems designed to maintain in the thrust position a pair of pins with sharp corners at the ends, which constitute the elements that grip the printed circuit.

The said elastic systems, subjected to the action of pistons which control their movement, enable the said pins to be maintained in the thrust position during the stages of gripping the circuit, and retracted for a certain distance during the loading and unloading stages.

BRIEF DESCRIPTION OF THE DRAWINGS

Further characteristics and details of this invention will emerge more clearly from the following description of a preferable form of manufacture, illustrated by way of example but not of limitation in the annexed drawings in which:

FIG. 3 illustrates a detail of the structural shape in question in cross-section, in the direction of arrow III—III in FIG. 2

FIG. 4 shows a schematic front view of one of the structural shapes on which a printed circuit has been mounted.

DESCRIPTION OF THE PREFERRED EMBODIMENTS

Figure 1:
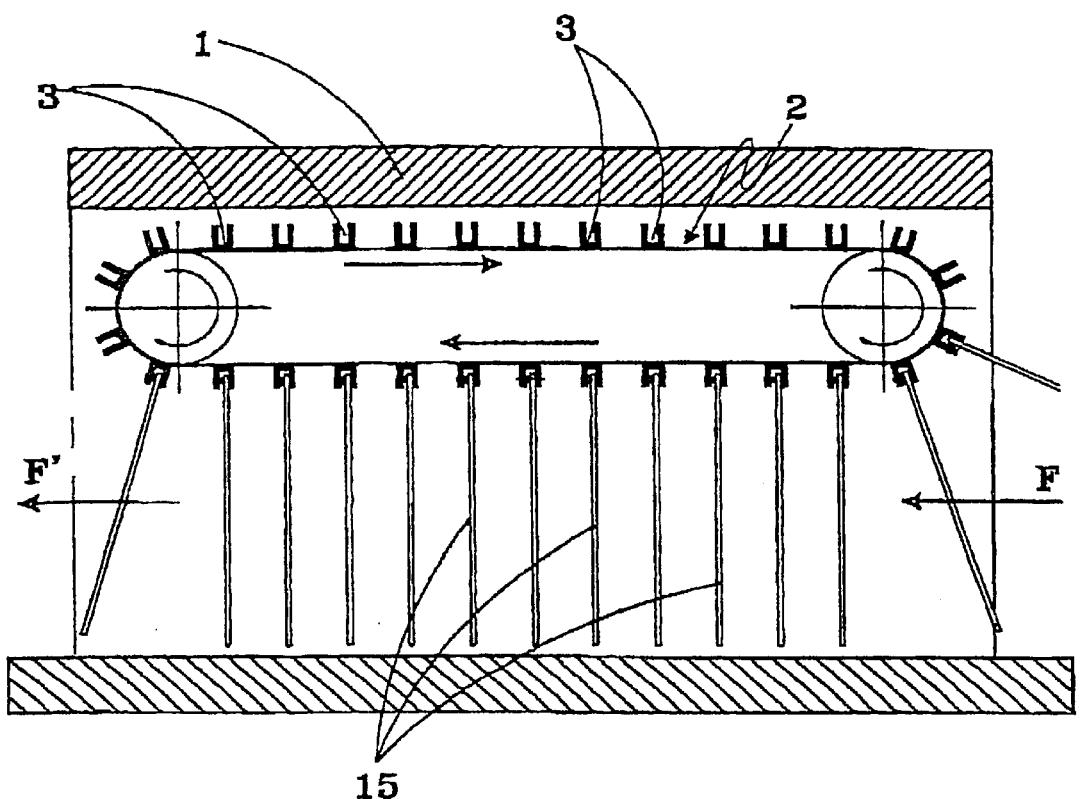
FIG. 1 shows the schematic side view of a tunnel kiln in which a printed circuit loading line fitted with gripping elements in accordance with the invention is installed
Figure 2:
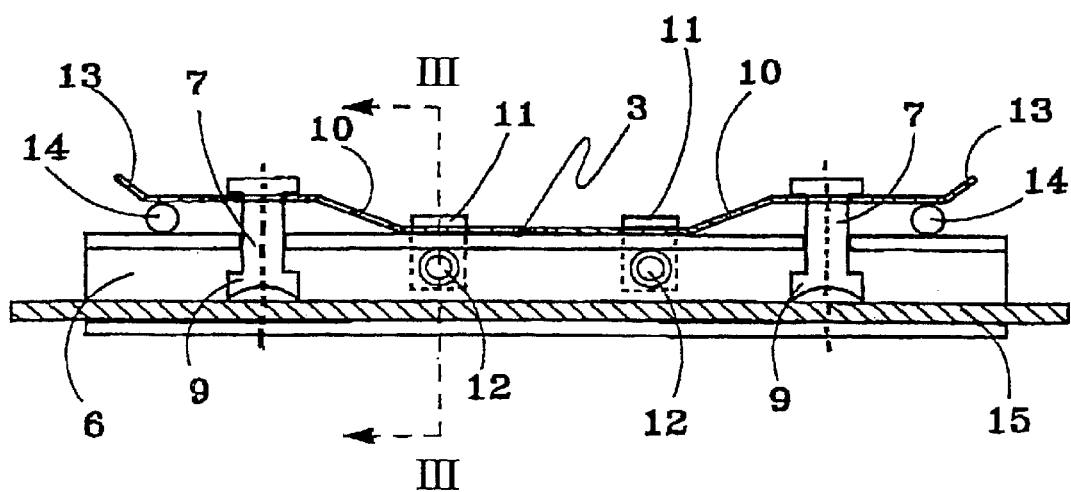
FIG. 2 represents a schematic view from below of one of the structural shapes designed to restrain a printed circuit

FIG. 1 shows printed circuits received from a car through opening F of a tunnel kiln 1 are hung from a conveyor line 2 in the upper interior part of the kiln, pass through the tunnel in which they undergo a firing process, and are picked up by a second car at exit F' and sent to the tin immersion cycle.

The characteristic feature of the invention is that it uses gripping systems which are simple, cheap and compact but highly functional. When fitted at regular intervals along conveyor 2 the gripping systems can restrain the cards, causing them to advance through the kiln.

The gripping systems, shown as no. 3, are applied and fixed parallel to one another on conveyor 2; they are constituted by a roughly U-shaped metal structural shape defined by two parallel walls 4 and 5 connected at right angles to base 6. see FIG.3

One of the two parallel walls contains two seatings into which two specially shaped pins 7, designed to slide axially, are inserted.

The pins have an outer head 8 and an inner end head 9 which has pointed gripping edges.

The ends of an elastic element 10, constituted by a leaf spring made, for example, of music wire, are fitted to outer head 8 of each of pins 7; the spring has a retracting central sector which is constrained to structural shape 3 via the L-shaped brackets shown as 11, which are secured with screws 12 to base 6.

Leaf spring 10 normally maintains each pin pushed towards the inside of the structural shape, so that inner head 9 tends to approach the opposite inner wall of the structural shape elastically.

The spring 10 also has ends 13 flared outwards to facilitate the introduction of rods 14, constituted by pneumatic piston rods or the like, which slightly distance the spring from structural shape 3 with consequent retraction of each pin 7, thus allowing the introduction and removal of printed circuit 15.

More specifically, rods 14 are activated in such a way that at entrance F to tunnel 1 they are inserted between structural shape 3 and the ends of leaf spring 10 to raise it and allow retraction of pins 7 and the introduction of the printed circuit into structural shape 3.

At the next stage, rods 14 are retracted to release the elastic thrust action of the spring on the pins, leading to hooking and restraint of the printed circuit 15 introduced into the structural shape.

Once hooked onto the corresponding structural shape 3, each printed circuit is made to advance by conveyor line 2 through tunnel kiln 1, thus remaining constrained in a hanging position.

A second pair of rods 14 comes into operation at exit F' from the tunnel; as in the previous case, they are introduced into the two flared ends of the elastic spring and cause pins 7 to retract, so that the printed circuits are released from the corresponding structural shapes, and can be unloaded into a pick-up car and conveyed to the molten tin immersion sector. It is advantageous for the outermost edges of each structural shape 3 to present flaring 16, which facilitates the introduction of the various printed circuits.

As seen, the special design of the structural shapes in accordance with the invention offers the advantage of simpler manufacture and much more limited size than known systems, resulting in a considerable increase in the carrying capacity of the conveyor line and the number of circuits that can be treated simultaneously.

In addition, as the presence of equipment secured with screws, which are needed for the assembly of known gripping jaws, has been totally eliminated, all risk of breakage or jamming of the gripping parts is avoided, as the said parts, which are subjected to the thrust and release action of elastic elements, withstand the high kiln temperatures without distortion. A preferred version of the hooking device in question, designed in particular for the firing of printed circuits, is described and illustrated, but a number of technically equivalent variations in the mechanical parts and components referred to are possible, and should be deemed to fall within. the scope of this invention.

Equally, the materials used can vary in accordance with practical requirements.

What is claimed is:

1. A device transport system, comprising:

a conveyor line;

plural supports mounted on the conveyor line, each support comprising a seating surface for accepting the insertion of a device; and an elastic system mounted on each of the plural supports and adapted to press the device against a first wall of the corresponding support, one of the supports comprising a U-shaped structural member with two holes in a second wall of the one support; and the elastic system of the one support comprising
      at least a pair of pins inserted through the two holes, and
      a bias component mounted on the second wall and arranged to bias the pins through the holes and against the first wall and to grip the device against the first wall.

2. The system of claim 1, further comprising drive devices co-acting with the elastic system of the one support to release the device from the one support, the bias component comprising
      a leaf spring with a central sector fixed to the structural member,
      the leaf spring having ends spaced from the structural member to define two insertion spaces,
      the ends being retractable, upon insertion of drive devices in the insertion spaces, from the structural member and upon retraction providing a force to disengage the pins from against the device and the first wall to release the device from the one support.

3. The system of claim 2, wherein the drive devices each comprise a rod and each of the insertion spaces are shaped to accept the rod of the drive devices.

4. The system of claim 3, wherein the pins are arranged to slide axially at a right angle to the first wall.

5. The device of claim 2, wherein the leaf spring elastically biases the pins towards the first wall of the structural member.

6. The device of claim 1, wherein the support comprises a U-shaped structural member with a seating surface adapted to allow insertion of the device;

the elastic system comprises
      at least one pin inserted through a hole in a second wall of the support,
      an elastic means for pushing the at least one pin toward the first wall of the support, and
      drive devices adapted to engage the elastic means to retract the at least one pin away from the first wall and to allow insertion of the device.

* * * * *